(12) United States Patent
Mehrotra et al.

(10) Patent No.: US 6,240,031 B1
(45) Date of Patent: May 29, 2001

(54) MEMORY ARCHITECTURE

(75) Inventors: Rakesh Mehrotra, Santa Clara; Pidugu L. Narayana, Sunnyvale, both of CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/534,760

(22) Filed: Mar. 24, 2000

(51) Int. Cl.$^7$ ................................................ G11C 7/00
(52) U.S. Cl. ..................... 365/220; 365/189.04; 365/221
(58) Field of Search ..................... 365/220, 230.03, 365/230.04, 189.04, 221

(56) References Cited

U.S. PATENT DOCUMENTS

| | | | |
|---|---|---|---|
| 4,283,761 | 8/1981 | Edelman et al. | 364/200 |
| 4,622,547 | 11/1986 | Furukawa et al. | 340/750 |
| 4,849,937 | * 7/1989 | Yoshimoto | 365/230.04 |
| 5,327,391 | * 7/1994 | Hirata | 365/230.04 |
| 5,469,558 | 11/1995 | Lieberman et al. | 395/285 |
| 5,502,655 | 3/1996 | McClure | 364/550 |
| 5,544,338 | * 8/1996 | Forslund | 365/230.04 |
| 5,572,477 | 11/1996 | Jung | 365/221 |
| 5,581,636 | 12/1996 | Skinger | 382/276 |
| 5,587,953 | 12/1996 | Chung | 365/220 |
| 5,640,332 | 6/1997 | Baker et al. | 364/514 A |
| 5,642,115 | 6/1997 | Chen | 341/67 |
| 5,642,318 | 6/1997 | Knaack et al. | 365/201 |
| 5,699,530 | 12/1997 | Rust et al. | 395/250 |
| 5,708,686 | 1/1998 | Assmus et al. | 375/372 |
| 5,748,555 | * 5/1998 | Park | 365/230.04 |
| 5,764,967 | 6/1998 | Knaack | 395/555 |
| 5,809,291 | 9/1998 | Munoz-Bustamante et al. | 395/556 |
| 5,835,752 | 11/1998 | Chiang et al. | 395/551 |
| 5,841,418 | 11/1998 | Bril et al. | 345/3 |
| 5,844,844 | 12/1998 | Bauer et al. | 365/189.05 |
| 6,016,283 | 1/2000 | Jeong | 365/233 |
| 6,072,741 | 6/2000 | Taylor | 365/219 |

* cited by examiner

*Primary Examiner*—Tan T. Nguyen
(74) *Attorney, Agent, or Firm*—Christopher P. Maiorana, P.C.

(57) ABSTRACT

An apparatus comprising a first memory and a second memory. The first memory may be configured read and write words from a data stream comprising a plurality of words in response to (i) a first read enable signal and (ii) a first write enable signal. The second memory may be configured to read and write words from the data stream in response to (i) a second read enable signal and (ii) a second write enable signal. The first and second memories may be configured to read and write alternate words of the data stream.

18 Claims, 8 Drawing Sheets

$T_{CYCLE} = \dfrac{T_F + T_{ENS}}{2}$   DUE TO TWO FLAGS = 200MHZ

MEMORY ARCHITECTURE

FIELD OF THE INVENTION

The present invention relates to FIFO memories generally and, more particularly, to flag generation and cascadability of memories at double data rate (DDR) frequencies.

BACKGROUND OF THE INVENTION

Flag generation and cascadability of DDR first-in first-out (FIFO) memories are factors limiting the maximum operating frequency. One conventional approach is to implement an external ping-pong logic and use two slower FIFOs. Referring to FIG. 1, an example of a circuit 10 illustrating a conventional FIFO is shown. Two or more conventional FIFOs 10a–10n, when implemented in parallel, illustrate such an external ping-pong logic approach. The FIFO 10 has an input 12 that receives an input data signal DATA_IN <36:0> and an output 14 that presents an output data signal DATA_OUT <36:0>. The circuit 10 also has an input 16 that receives a read enable signal RENABLE and an input 18 that receives a write enable signal WENABLE. The circuit 10 also has an output 20 that presents an empty flag EF and an output 22 that presents a full flag FF. The inputs to the FIFOs 10a–10n need to be connected in parallel and the outputs ping-pong every cycle, which results in (i) frequency degradation and/or (ii) the requirement of more board space.

Referring to FIG. 2, a timing diagram illustrating the operation of the circuit of FIG. 1 is shown. A time Tf is shown as the time between a rising edge of the signal CLK and the enabling of the signal FLAG. Time Tens is equal to the difference between the time that the signal FLAG is enabled and the next rising edge of the signal CLK. As a result, the cycle time Tcycle is generally equal to the time Tf plus the time Tens. An example of a 100 Mhz signal CLK, the signal Tcycle is equal to 8 ns (e.g., Tf)+2 ns (e.g., Tens), for a total cycle time of 1ons.

Another conventional technique for implementing DDR FIFOs is to implement logic by using a slower and wider FIFO. Such an approach has the disadvantages of (i) being difficult to implement bus matching, (ii) having latency of at least two words, (iii) not implementing an odd word read out and/or (iv) consuming more board space.

Referring to FIG. 3, a circuit 30 illustrating a conventional width cascading architecture is shown. The circuit 30 has the disadvantage of being difficult to implement with bus matching. The circuit 30 alternately writes a first word of the signal DATA_IN to a FIFO 32 and a second word to a FIFO 34. The circuit 30 also alternately reads a first word from the FIFO 32 and the FIFO 34. The circuit 30 has the disadvantages of (i) being difficult to route the DATA_OUT on the board, (ii) having frequency of operation that is lower because of the loading on DATA_OUT and (iii) crowbar issues.

Referring to FIG. 4, an example of a circuit 70 implementing a conventional cascading (depth expansion) architecture is shown. The signal DATA_IN is presented through a FIFO 72, a FIFO 74 and a FIFO 76. The circuit 70 has the disadvantage of high latency through each of the FIFOs 72, 74 and 76.

SUMMARY OF THE INVENTION

One aspect of the present invention concerns an apparatus comprising a first memory and a second memory. The first memory may be configured read and write words from a data stream comprising a plurality of words in response to (i) a first read enable signal and (ii) a first write enable signal. The second memory may be configured to read and write words from the data stream in response to (i) a second read enable signal and (ii) a second write enable signal. The first and second memories may be configured to read and write alternate words of the data stream.

Another aspect of the present invention concerns an apparatus comprising a first memory, a second memory, a control circuit and a flag circuit. The first and second memories may each be configured to store data received from a first data input and present data to a first data output. The control circuit may be configured to control data stored in response to a write clock and control data presented in response to a read clock. The flag circuit may be configured to generate one or more composite flags in response to the first memory and the second memory.

The objects, features and advantages of the present invention include providing a memory architecture that may (i) double the operational clock frequency of existing FIFO technology by using internally slow divided clocks to drive internal odd and even FIFOs based on bus matching, (ii) improve performance that may be obtained by an automatic ping-pong of the data between internal odd and even FIFOs, which may essentially double the clock speed of the architecture, (iii) implement minimal logic that needs to operate at maximum frequency, (iv) allow at speed bus matching on a number of ports, (v) have two internal FIFOs working at half the frequency of an external clock, (vi) implement internal clock generation logic based on external bus matching mode, and/or (vii) be extended to multiple FIFOs with corresponding signals and flags to achieve an effective increase in the clock operating frequency.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
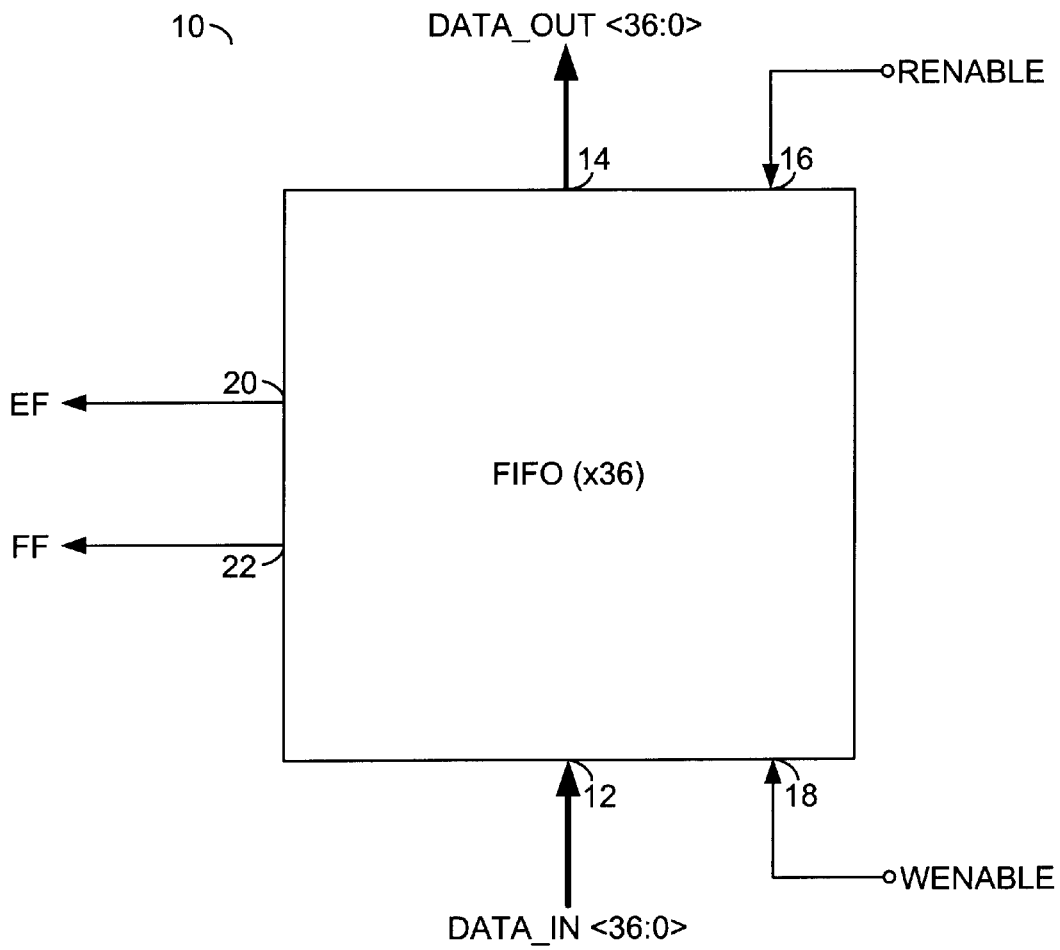
FIG. 1 is a block diagram of a conventional FIFO memory.
Figure 2:
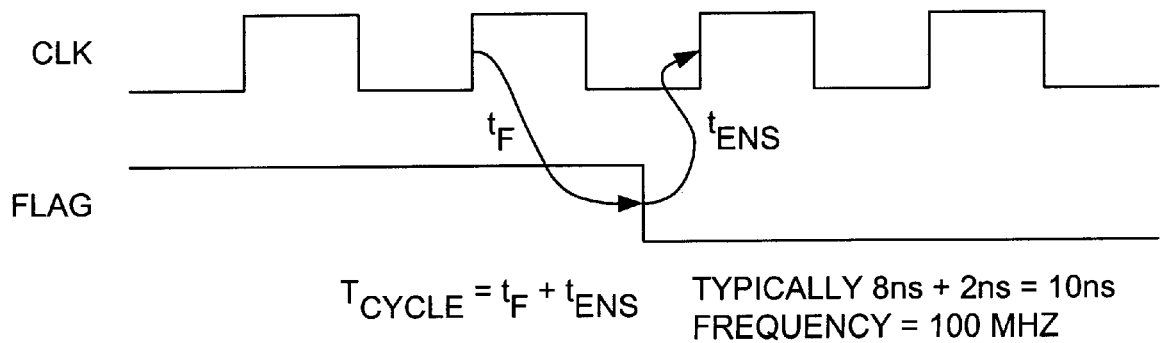
FIG. 2 is a timing diagram of the circuit of FIG. 1.
Figure 3:
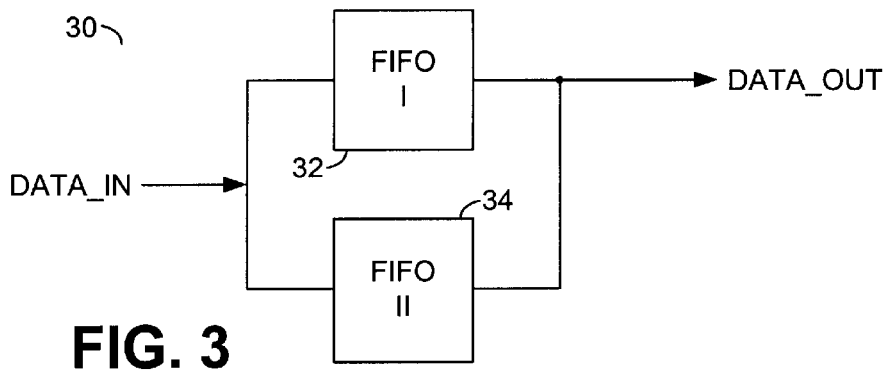
FIG. 3 is a block diagram of a conventional architecture for cascading conventional FIFO memories.
Figure 5:
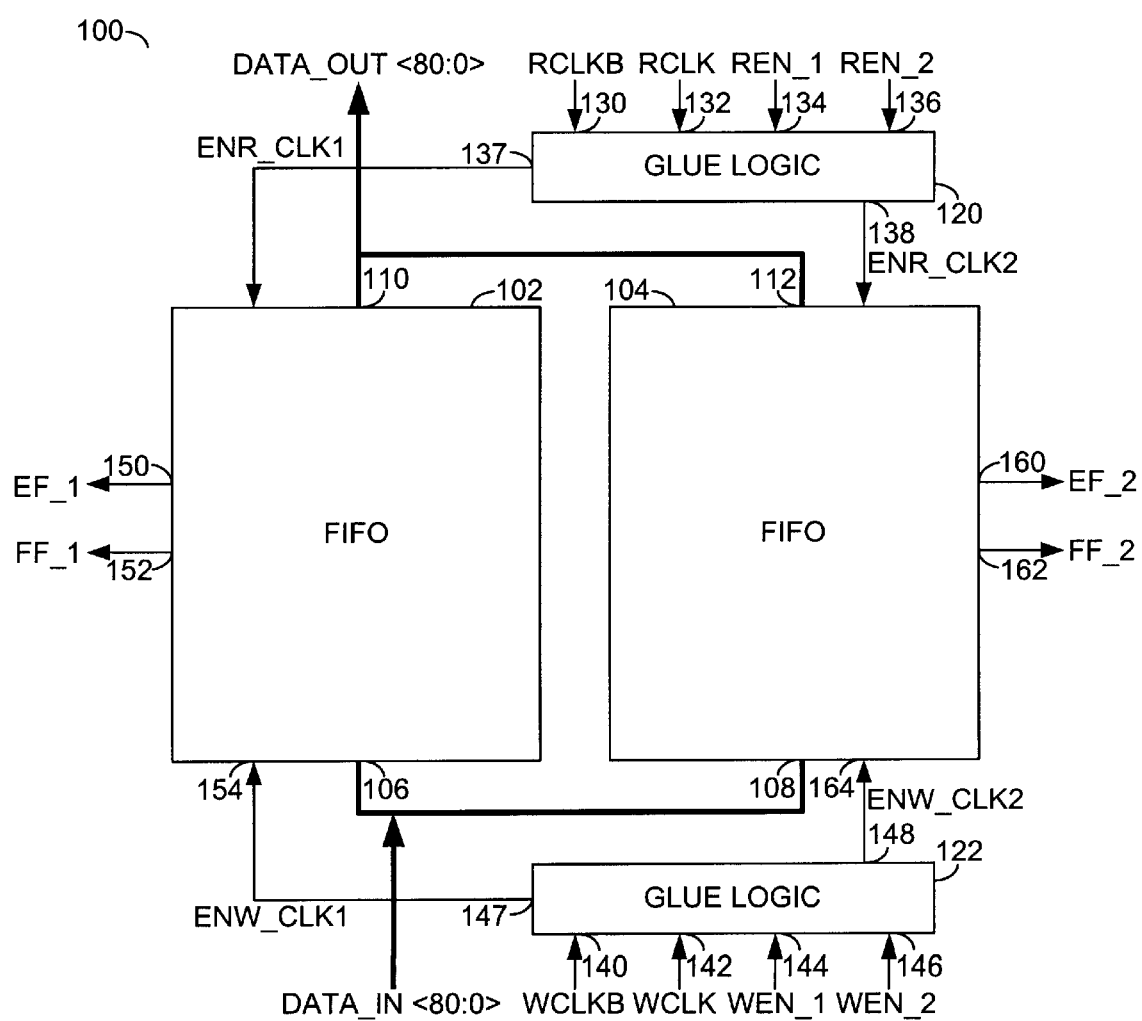
FIG. 5 is a block diagram of a preferred embodiment of the present invention.
Figure 4:
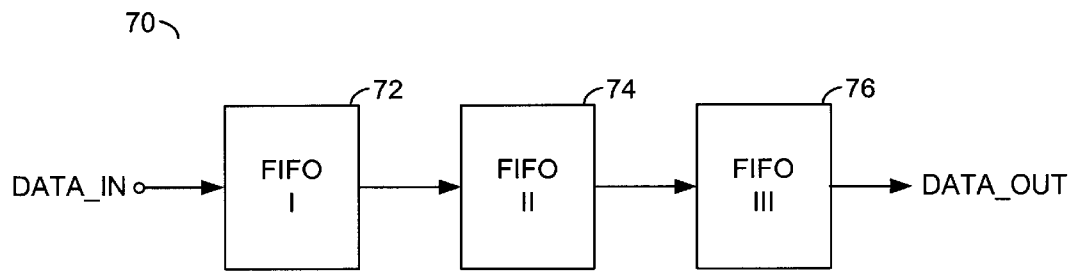
FIG. 4 is a block diagram of a conventional architecture for cascading conventional FIFO memories.

Referring to FIG. 5, a block diagram of a circuit 100 is shown in accordance with a preferred embodiment of the present invention. The circuit 100 may be implemented as an architecture that may remove the flag logic from the critical path (e.g., the high speed data path). The circuit 100 may also allow convenient cascadability.

The circuit generally comprises a FIFO 102 and a FIFO 104. The FIFO 102 may have an input 106 that may receive a data input signal (e.g., DATA_IN<80:0>). The FIFO 104 may have an input 108 that may receive the signal DATA_IN<80:0>. The FIFO 102 may have an output 110 that may present a portion of an output signal (e.g., DATA_OUT<80:0>). Similarly, the FIFO 104 may have an output 112 that may present another portion of the output signal DATA_OUT<80:0>. The signal DATA_IN<80:0> and the signal DATA_OUT<80:0> are shown as 80-bit signals. However, other bit-widths may be implemented accordingly to meet the design criteria of a particular implementation. The FIFO 102 and the FIFO 104 may be implemented on a single integrated circuit.

The circuit 100 may also comprise a logic circuit 120 and a logic circuit 122. The logic circuit 120 may have an input 130 that may receive a read clock signal (e.g., RCLKB), an input 132 that may receive a read clock signal (e.g., RCLK), an input 134 that may receive a read enable signal (e.g., REN_1) and an input 136 that may receive a read enable signal (e.g., REN_2). The logic circuit 120 may have an output 137 that may present a first enabled read clock (e.g., ENR_CLK1) and an output 138 that may present a second enabled read clock (e.g., EN_CLK2). The read clock signal RCLK and the read clock signal RCLKB may be complementary clock signals.

The logic circuit 122 may have an input 140 that may receive a write clock signal (e.g., WCLKB), an input 142 that may receive a write clock signal (e.g., WCLK), an input 144 that may receive a first write enabl e signal (e.g., WEN_1) and an input 146 that may receive a second write enable signal (e.g., WEN_2). The logic circuit 122 may have an output 147 that may present a first enabled write clock signal (e.g., ENW_CLK1) and an output 148 that may present a second enabled write clock signal (e.g., ENW_CLK2). The write clock signal WCLK and the write clock signal WCLKB may be complementary signals.

The FIFO 102 may have an output 150 that may present an empty flag (e.g., EF_1), an output 152 that may present a full flag (e.g., FF_1), and an input 154 that may receive the signal ENW_CLK1. The FIFO 104 may have an output 160 that may present an empty flag (e.g., EF_2), an output 162 that may present a full flag (e.g., FF_2) and an input 164 that may receive a signal (e.g., ENW_CLK2).

The circuit 100 may be implemented with, in one example, two separate FIFOs 102 and 104. The FIFOs 102 and 104 may each have distinct empty flags (e.g., EF_1 and EF_2), full flags (e.g., FF_1 and FF_2), read enable signals (e.g., REN_1 and REN_2) and write enable signals (e.g., WEN_1 and WEN_2) for each of the FIFOs 102 and 104. In one example, the odd words may be written to and read from the FIFO 102 and the even words may written to and read from the FIFO 104. By writing and reading the odd and even words to the separate FIFOs 102 and 104, the words may be written/read on either edge of the reference clock (e.g., rising/falling). In general, the read enable signal REN_1 and the write enable signal WEN_1 are associated with the positive edges of the read clock signal RCLK and write clock signal WCLK while the signals REN_2 and WEN_2 are associated with the negative edges of the read clock signal RCLK and write clock signal WCLK. However, an opposite polarity may be implemented to meet the design criteria of a particular implementation. By associating particular enable signals with the positive and negative edges of the read clock signal RCLK or write clock signal WCLK, the circuit 100 may automatically ping-pong data between the two FIFOs. Additionally, the enable signals REN_1, REN_2, WEN_1 and WEN_2 may allow cascadability of the circuit 100.

The empty flag EF1 and the full flag FF_1 are generally associated with the odd FIFO (e.g., the FIFO 102) and the empty flag EF_2 and the full flag FF_2 are generally associated with the even FIFO (e.g., the FIFO 104). The empty flags EF_1 and EF_2 may be combined to form a single composite flag (not shown). The full flags FF_1 and FF_2 may be combined to form a composite flag. One way to combine the flags EF_1 and EF_2 or FF_1 and FF_2 may be with a logic gate, such as an AND gate. However, other gates may be implemented to meet the design criteria of a particular implementation. Additionally, other flags (e.g., almost full flags, almost empty flags, half full flags, etc.) may be implemented accordingly to meet the design criteria of a particular implementation. Examples of particular flag generation circuitry may be found in U.S. Pat. Nos. 5,712,992; 5,809,339; 5,627,797; 5,850,569 or 5,852,748, which are each incorporated by reference in their entirety. However, the present invention is not limited to such circuitry.

The logic circuit 120 may be used to generate the internal clock signal ENR_CLK2 from the read enable signals REN_1 and REN_2 and the read clock signals RCLK and RCLKB. Similarly, the logic circuit 122 may be used to generate the internal clock signal ENW_CLK2 in response to the write enable signals WEN_1 and WEN_2 and the write clock signals WCLK and WCLKB.

The circuit 100 may use two of each of the read enable signals REN_1 and REN_2, write enable signals WEN_1 and WEN_2, empty flags EF_1 and EF_2 and full flags FF_1 and FF_2 to attain a data rate that may be double the data rate of conventional FIFOs. The circuit 100 may allow a glue-less interconnect for depth expansion of FIFOs. The enable inputs (e.g., REN_1, REN_2, WEN_1 and WEN_2) may be associated with both edges of the FIFO clocks (e.g., RCLK, RCLKB, WCLK, and WCLKB). The empty/full flags (e.g., EF_1, EF_2, FF_1, and FF_2) may be associated with each of the internal odd and even FIFOs 102 and 104, where the internal FIFOs 102 and 104 handle odd and even words, respectively.

Figure 6:
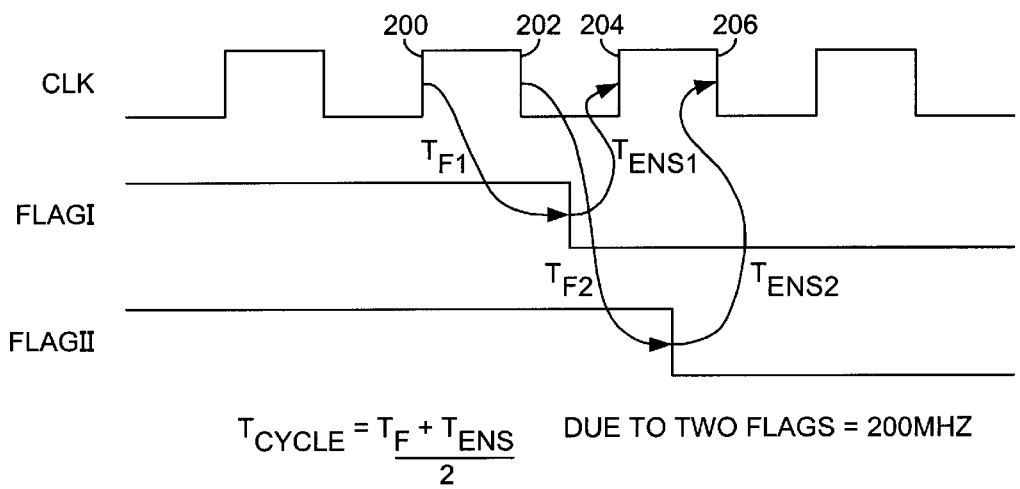
FIG. 6 is a timing diagram illustrating an operation of the circuit of FIG. 5.

Referring to FIG. 6, a timing diagram is shown illustrating an operation of flag circuits (not shown) of the circuit 100. A time Tf1 is shown as a time between a positive edge 200 of the signal CLK (e.g., RCLK or WCLK) and a transition of the signal FLAG1 (e.g., EF_1 or FF_1). A time Tf2 is shown as a difference between a negative transition 202 of the signal CLK (e.g., RCLK or WCLK) and a transition of the signal FLAG2 (e.g., EF_2 or FF_2). A time Tens1 represents the time between the transition of the signal FLAG1 and the next transition (e.g., 204) of the signal CLK. Similarly, the time Tens2 represents a time between the transition of the signal FLAG2 and the next transition (e.g., 206) of the signal CLK. Since both flags are generated, the total cycle time Tcycle is generally equal to the time Tf1 plus the time Tens1 divided by 2. Similarly, the total cycle time Tcycle may also be characterized as the time Tf2 plus the time Tens2 divided by 2.

Figure 7:
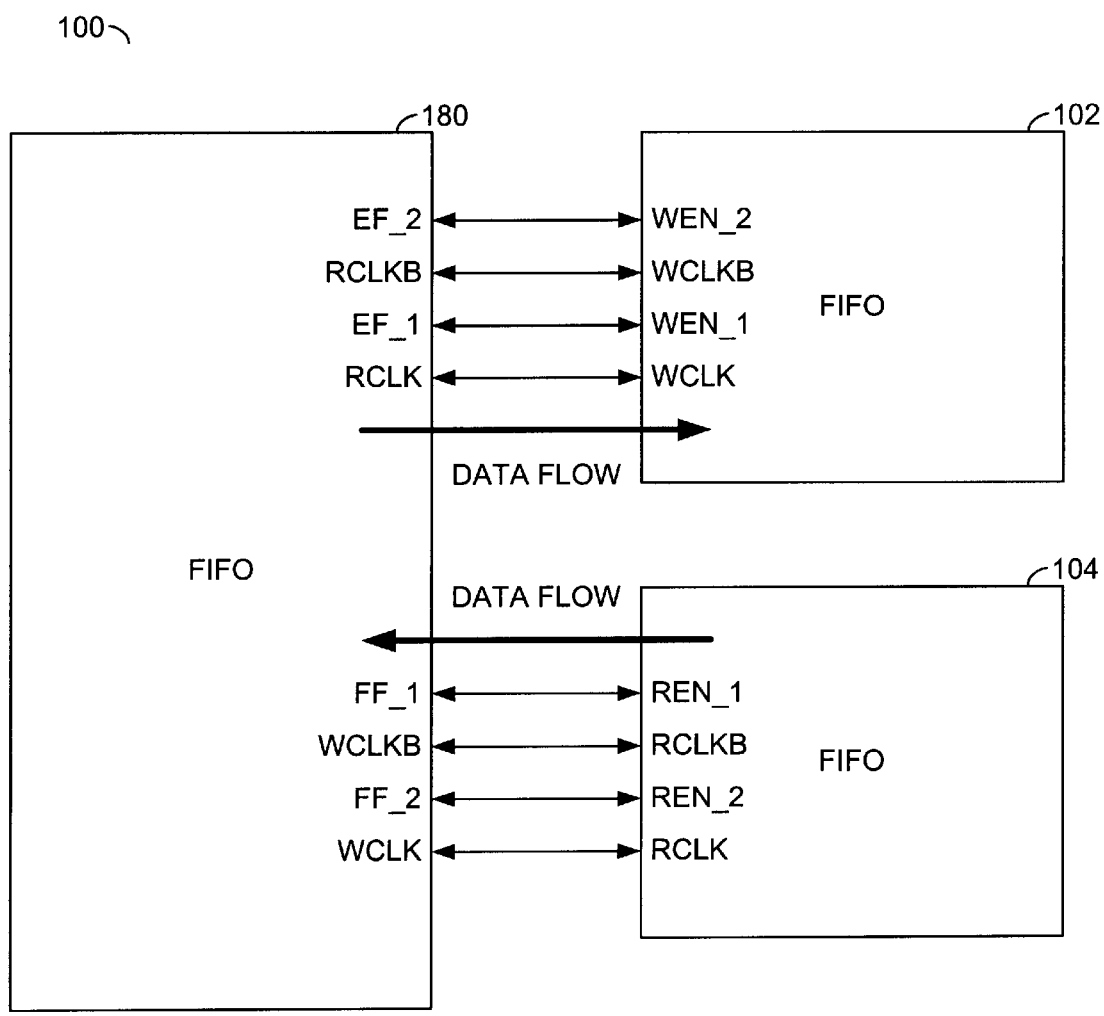
FIG. 7 is a block diagram illustrating an operation of the circuit of FIG. 5.

Referring to FIG. 7, a block diagram illustrating data flow of the circuit 100 is shown. The circuit 100 may illustrate a particular flow of data (a cascading configuration (e.g., depth expansion) of the FIFO 102 and the FIFO 104 through a FIFO 180). Data may be read from the FIFO 104 in response to the signals REN_1, RCLKB, REN_2 and RCLK. Data may be written to the FIFO 102 in response to the signals WEN_1, WCLKB, WEN_2 and WCLK. The flow of data of the circuit 100 may be controlled by the FIFO 180.

Figure 8:
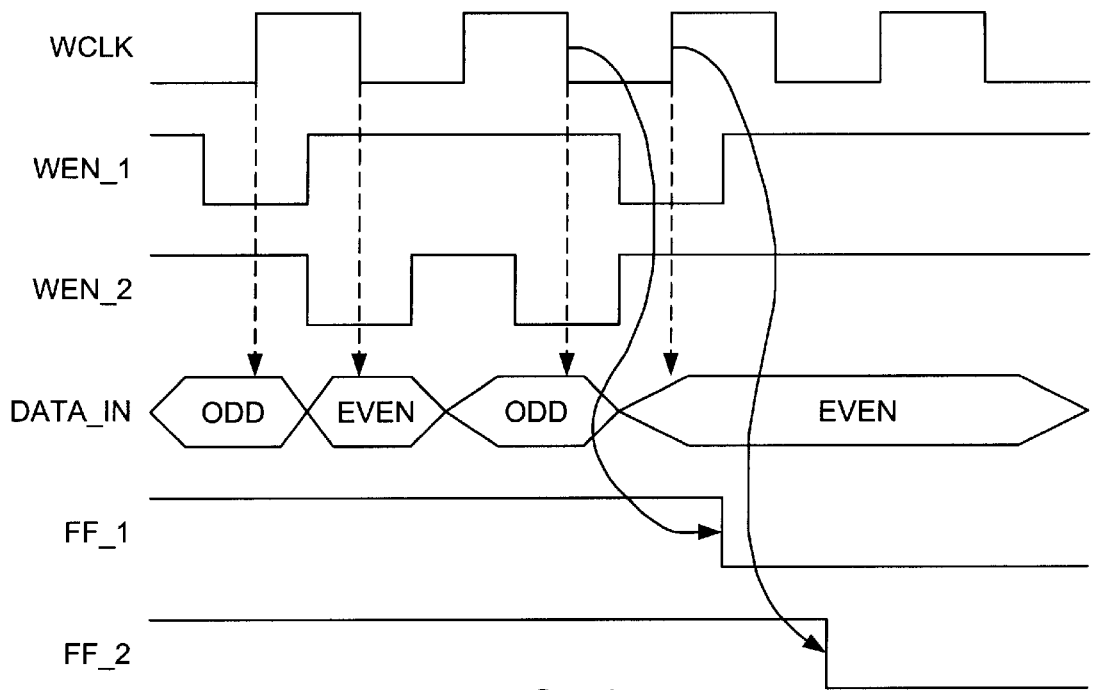
FIG. 8 is a timing diagram illustrating an operation of the circuit of FIG. 5.

Referring to FIG. 8, a timing diagram illustrating an operation of the present invention is shown. The timing diagram illustrates a writing operation of the circuit 100. The write enable signal WEN_1 may allow data to be written to either an even or odd FIFO (e.g., 102 or 104). The write enable signal WEN_2 may allow data to be written to either an even or an odd FIFO (e.g., 102 or 104). The write clock WCLK may allow data to be written to either the odd or the even FIFO (e.g., 102 or 104). The write clock WCLK may cause data to switch from a present enabled writing FIFO (e.g., first even or odd) to a next enabled writing FIFO (e.g., remaining even or odd), if applicable. The write enable signal, WEN_1 and WEN_2 may be responsive to the write clock signal WCLK, which may allow ping-pong of data to be written. The even and/or odd FIFO, when full, may change a logic state of the full flag FF_1 and/or FF_2, respectively.

Figure 9:
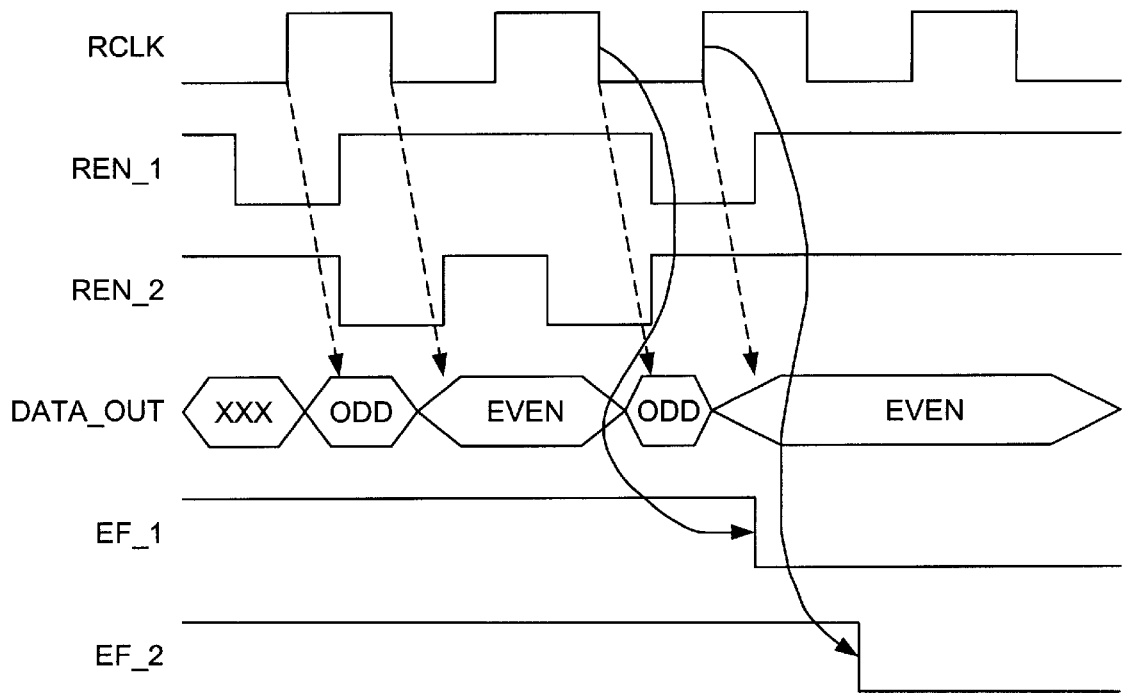
FIG. 9 is a timing diagram illustrating an operation of the circuit of FIG. 5.

Referring to FIG. 9, a timing diagram illustrating the operation of the present invention is shown. The timing diagram illustrates a reading operation of the circuit 100. The read enable signal REN_1 may allow data to be read from, for example, the odd FIFO. The read enable signal REN_2 may allow data to be read from, for example, the even FIFO. The read clock signal RCLK may allow data to be read from either the odd or the even FIFO. The read clock signal RCLK may cause data to switch from a present enabled read FIFO (e.g., even or odd) to a next enabled read FIFO (e.g., remaining even or odd), if applicable. The even and/or odd FIFO, when full, may change a logic state of the empty flag EF_1 and/or EF_2, respectively.

Figure 10:
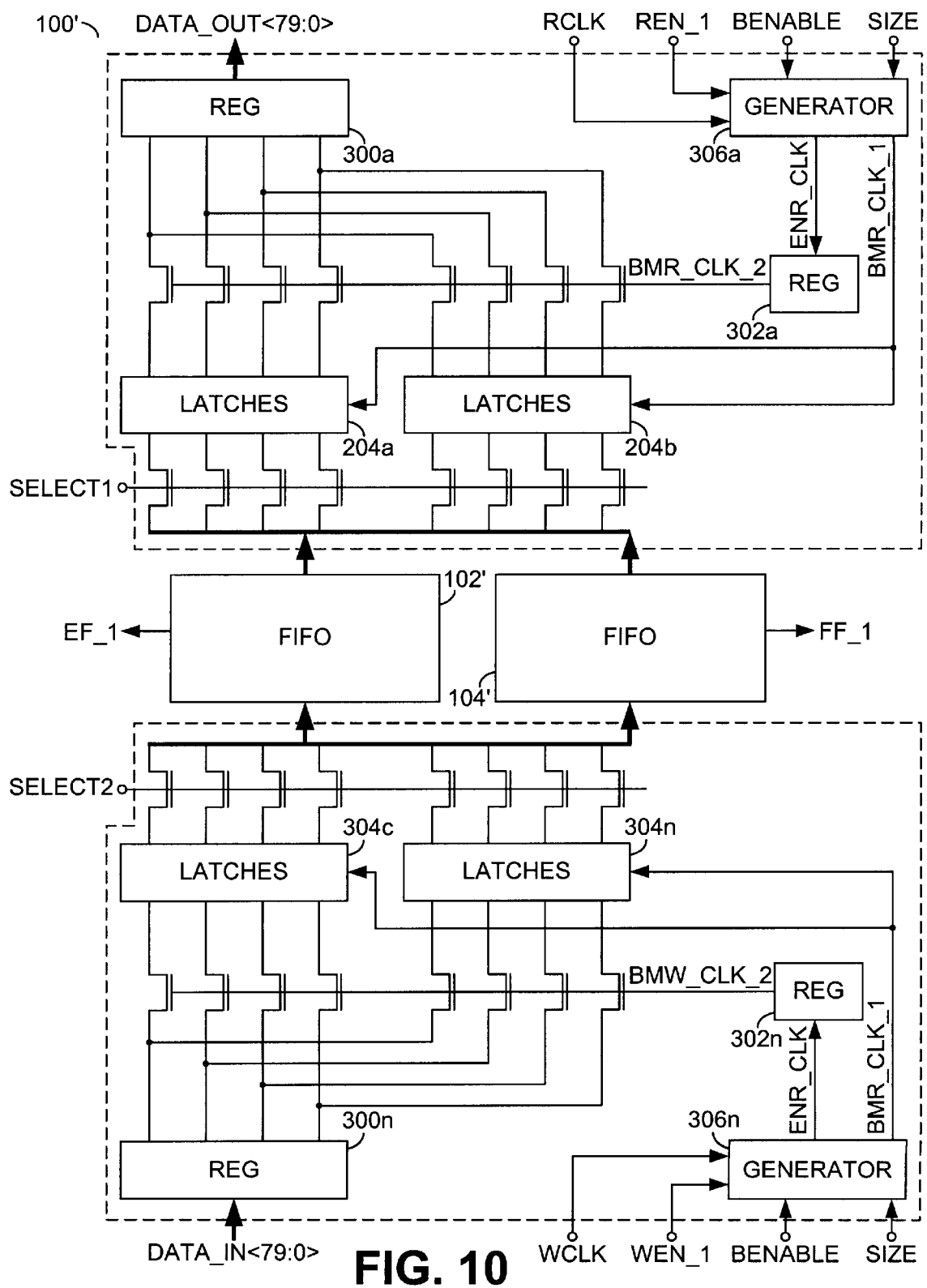
FIG. 10 is a detailed block diagram of an alternate embodiment of the present invention.

Referring to FIG. 10, an alternate embodiment of the circuit 100 is shown marked with primed notation. The circuit 100' may be similar to the circuit 100. The circuit 100 may comprise a number of registers 300a–300n, a number of registers 302a–302n, a number of latches 304a–304n and a number of clock generators 306a–306n. The registers 300a–300n may be used to store the data in DATA_IN<80:0> and the data out DATA_OUT<80:0>. The clock generators 306a–306n may be implemented to generate read and write enable signals ENR_CLK and ENW_CLK, respectively. The registers 302a–302n may be implemented to store the enable signals. The latches 304a–304n may be implemented to latch the data in DATA_IN<80:0> and the data out DATA_OUT<80:0>.

The circuit 100' may double a clock speed of the FIFOs 102' and 104'. The circuit 100' may maintain backward pin and functional capability to existing FIFOs. The circuit 100' may allow at speed bus matching on both the input and output ports of the FIFOs 102' and 104'. The circuit 100' may provide two internal FIFOs (102' and 104') operating at half an external frequency. The circuit 100' may provide an internal clock generation logic based on external bus matching modes. Additionally, the circuit 100' may allow multiple FIFOs with corresponding signals and flags to achieve $2^n$ speed-up in the clock operating frequency.

Figure 11:
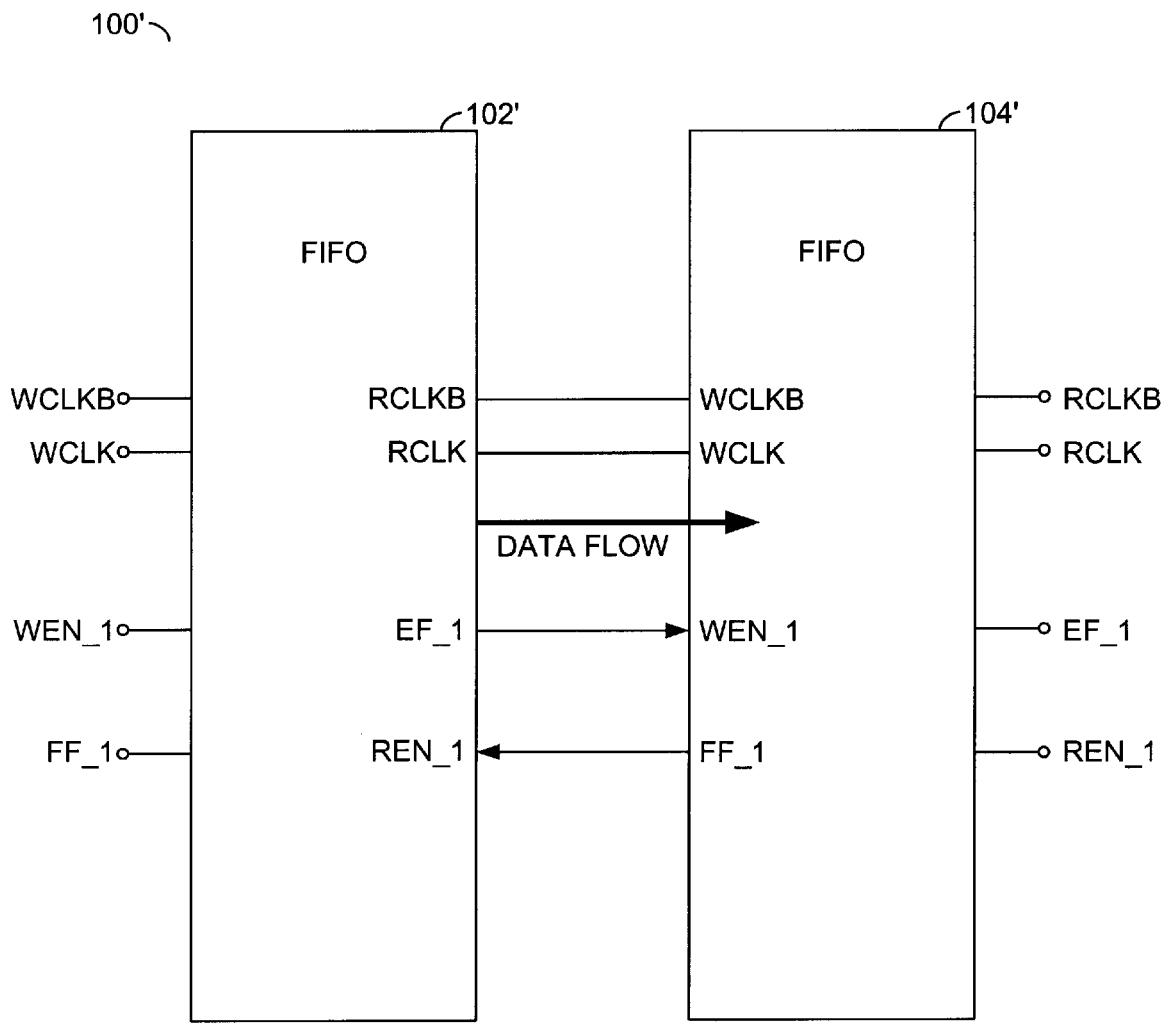
FIG. 11 is a block diagram illustrating an operation of the circuit of FIG. 10.

Referring to FIG. 11, a simplified block diagram of the circuit 100' is shown. The circuit 100' may illustrate a cascading configuration (e.g., depth expansion) of the FIFO 102' and the FIFO 104'. Data may be written to the FIFO 102' in response to the signals WEN_1, WEN_2, WCLK, and WCLKB. Data may be read from the FIFO 102' in response to the signals REN_1, REN_2, RCLK, and RCLKB. Reading and writing of data from/to the FIFO 104' may be implemented similarly. Each of the FIFOs 102' and 104' may include read and write logic (not shown). The FIFOs 102' and 104' may read and write without additional external logic.

Figure 12A:
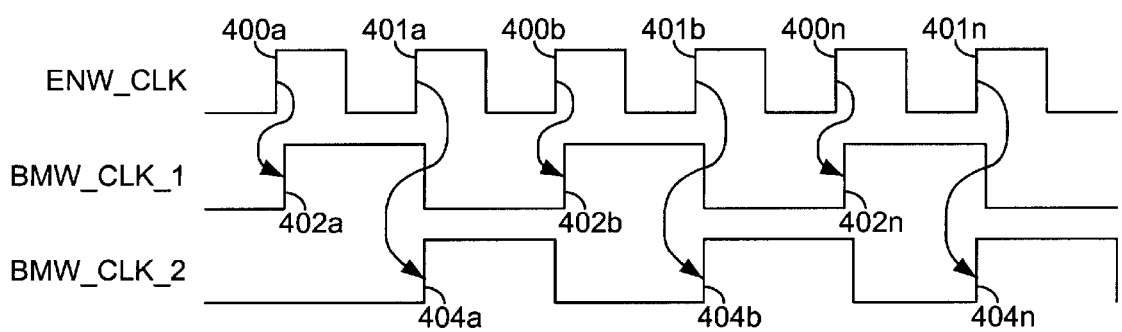
FIGS. 12(a)–12(b) are timing diagrams illustrating an operation of the circuit of FIG. 10.
Figure 12B:
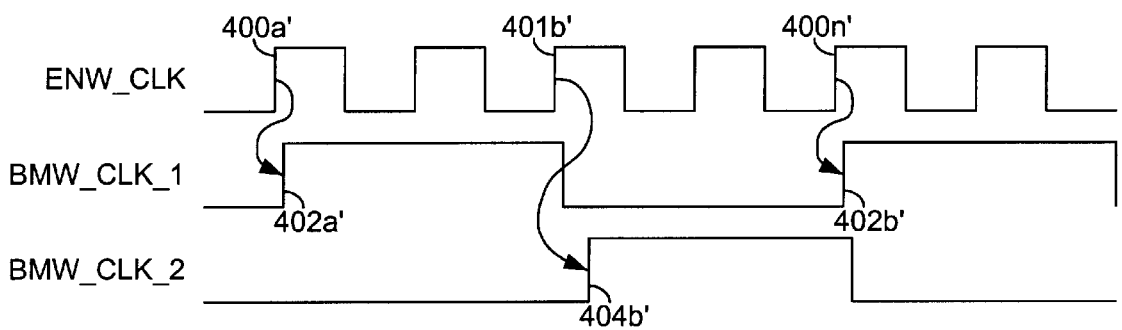

FIGS. 12(a)–12(b) illustrate writing to the FIFOs with and without glue logic. The signal BMW_CLK_1 may have a number of positive transitions 402a–402n that responds to every second positive transition 400a–400n of the signal ENW_CLK. The signal BMW_CLK_2 may also have a number of positive transitions 404a–404n that may each respond to an alternate number of positive transitions of the signal ENW_CLK. As a result, the circuit 100 (or 100') may write data at twice the speed of conventional memories.

In FIG. 12(b), an implementation of the signals BMW_CLK_1 and BMW_CLK_2 illustrates an example where a number of positive transitions 402a'–402b' are shown on every second positive transition 400a'–400n' of the signal ENW_CLK. The signal BMW_CLK_2' may have alternate positive transition on every fourth positive transition 401b' of the signal ENW_CLK. The writing in FIG. 12a generally occurs twice as often as the writing in FIG. 12b.

The signal BMW_CLK_1 and the signal BMW_CLK_2 may be implemented for bus matching of the circuit 100 (or 100'). In one example, the FIFOs 102 and 104 may be implemented in an 80-bit mode, the internal clock (ENW_CLK) may be divided by two. The divided internal clock ENW_CLK may allow the circuit 100 (or 100') to achieve twice frequency of operation, since there are two FIFOs 102 and 104. If the FIFOs 102 and/or 104 is written to in a 40-bit mode, the internal clock ENW_CLK may be divided once more.

If the circuit 100 (or 100') writes data into a first 40 bits (½ of the 80 latches) then a next 40 bits may be written to a remaining 40 bits. The signal BMW_CLK_1 may be generated to write data to the FIFO memory 102 and/or 104 (shown in FIGS. 12(a)–(b)). The signal BMW_CLK_2 may operate similarly to the signal BMW_CLK_1. The circuit 100 (or 100') may write data to the FIFOs 102 and 104 in the 80-bit mode, even while in the 40-bit mode.

Figure 13A:
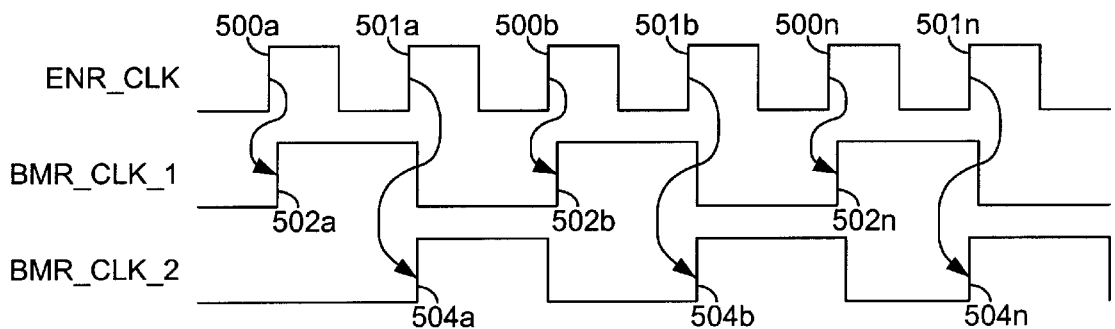
FIGS. 13(a)–13(b) are timing diagrams illustrating an operation of the circuit of FIG. 10.
Figure 13B:
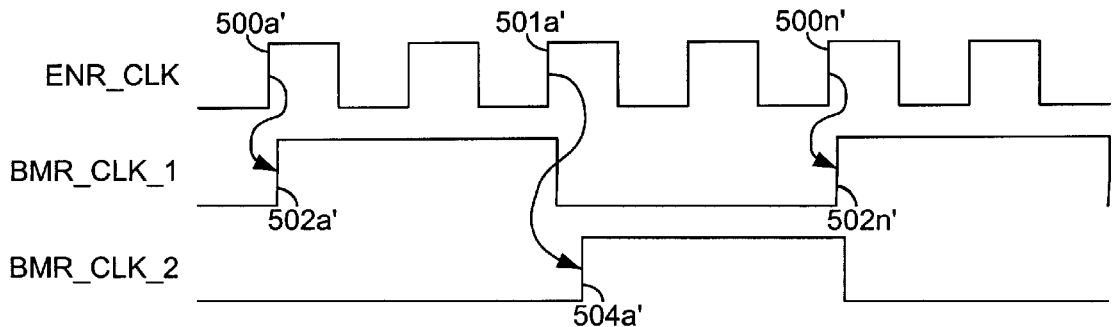

FIGS. 13(a)–13(b) illustrate reading from FIFOs with and without glue logic. The signal BMR_CLK_1 has a number of positive transitions 502a–502n that generally occur on every second positive transition 500a–500n of the signal ENR_CLK. The signal BMR_CLK_2 has a number of positive transitions 504a–504n that generally occur on every second positive transition 501a–501n of the signal ENR_CLK. The positive transitions of the signal BMR_CLK_1 are generally offset from the positive transitions of the signal BMR_CLK_2.

In FIG. 13(b), the signal BMR_CLK_1 is shown having a number of positive transitions 502a'–502n' that respond to every fourth positive transition 500a'–500n' of the signal ENR_CLK. The signal BMR_CLK_2 generally has a number of positive transitions 504a'–504n' that generally respond to every fourth positive transition 501a'–501n' of the signal ENR_CLK. In general, the signal BMR_CLK_1 has positive transitions when the signal BMR_CLK_2 have negative transitions. The reading in FIG. 13a generally occurs twice as often as the reading in FIG. 13b. The signal BMR_CLK_1 and the signal BMR_CLK_2 may be implemented for bus matching.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first memory configured to read and write a data stream comprising a plurality of words in response to (i) a first read enable signal and (ii) a first write enable signal;
   a second memory configured to read and write said data stream in response to (i) a second read enable signal and (ii) a second write enable signal, wherein said first and second memories are configured to read and write alternate words of said data stream;
   a first control circuit configured to generate said first and second read enable signals; and
   a second control circuit configured to generate said first and second write enable signals.

2. The apparatus according to claim 1, wherein said first and second memory are further configured to read and write on a positive and negative transition of an input clock.

3. The apparatus according to claim 1, wherein said first control circuit is configured to respond to a first read clock.

4. The apparatus according to claim 3, wherin said first control circuit if further configured in response to a second read clock.

5. The apparatus according to claim 4, wherein said second control circuit is configured to respond to a first write clock.

6. The apparatus according to claim 5, wherein said second control circuit is further configured in response to a second write clock.

7. The apparatus according to claim 6, wherein (i) said second read clock comprises a complement of said first read clock and (ii) said second write clock comprises a complement of said first write clock.

8. The apparatus according to claim 3, wherein said first and second memories are connected in parallel.

9. The apparatus according to claim 3, wherein said first control circuit comprises a read glue logic circuit and said second control circuit comprises a write glue logic circuit.

10. The apparatus according to claim 3, wherein said first control circuit is configured to respond to one or more read enable signals.

11. The apparatus according to claim 3, wherein said second control circuit is configured to respond to one or more write enable signals.

12. An apparatus comprising:
   means for reading and writing a data stream comprising a plurality of words in response to (i) a first read enable signal and (ii) a first write enable signal;
   means for reading and writing said data stream in response to (i) a second read enable signal and (ii) a second write enable signal, wherein said first and second means for reading and writing are configured to read and write alternate words of said data stream;
   means for generating said first and second read enable signals; and
   means for generating said first and second write enable signals.

13. A method for increasing the speed of a memory device comprising the steps of:
   (A) reading and writing a data stream comprising a plurality of words to a first portion of said memory in response to (i) a first read enable signal and (ii) a first write enable signal;
   (B) reading and writing said data stream to a second portion of said memory in response to (i) a second read enable signal and (ii) a second write enable signal, wherein steps (A) and (B) write alternate words of said data stream;
   (C) generating said first and second read enable signals using a first control circuit; and
   (D) generating said first and second write enable signals using a second control circuit.

14. The method according to claim 13, further comprising step:
   (E) controlling reading from said first and second portions.

15. The method according to claim 14, further comprising step:
   (F) controlling writing to said first and second portion.

16. The method according to claim 15, wherein step (F) is responsive to one or more write clocks.

17. The method according to claim 15, wherein step (E) is responsive to one or more read enable signals and step (F) is responsive to one or more write enable signals.

18. The method according to claim 14, wherein step (E) is responsive to one or more read clocks.

* * * * *